United States Patent
Matano (10) Patent No.: US 7,542,364 B2
(45) Date of Patent: Jun. 2, 2009

(54) SEMICONDUCTOR MEMORY DEVICE

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 24 days.

(21) Appl. No.: 11/760,831

(22) Filed: Jun. 11, 2007

(65) Prior Publication Data

US 2007/0297208 A1    Dec. 27, 2007

(30) Foreign Application Priority Data

Jun. 27, 2006    (JP)    ............................. 2006-177204

(51) Int. Cl.
*G11C 7/02*    (2006.01)
(52) U.S. Cl. .................. 365/207; 365/205; 365/51; 365/53
(58) Field of Classification Search ................ 365/207, 365/205, 51, 63
See application file for complete search history.

(56) References Cited

U.S. PATENT DOCUMENTS 6,477,100 B2 *    11/2002    Takemura et al. ........... 365/207
6,480,425 B2 *    11/2002    Yanagisawa et al. ... 365/189.05

FOREIGN PATENT DOCUMENTS

JP    2005-302077 A    10/2005

* cited by examiner

*Primary Examiner*—Tuan T Nguyen
*Assistant Examiner*—Toan Le
(74) *Attorney, Agent, or Firm*—Sughrue Mion, PLLC (57) ABSTRACT

A semiconductor memory device includes a plurality of sense amplifiers each supplying a higher write potential and a lower write potential to each of memory cells; a driver circuit supplying the higher write potential to each of the sense amplifiers; a driver circuit supplying the lower write potential to each of the sense amplifiers; and an auxiliary driver circuit supplying either the lower write potential or an auxiliary potential lower than the lower write potential to each of the sense amplifiers. It is thereby possible to suppress a fluctuation in the lower write potential at start of a sensing operation. Therefore, the sensing operation can be accelerated as compared with a sensing operation performed by sense amplifiers in a conventional semiconductor memory device.

20 Claims, 10 Drawing Sheets

SEMICONDUCTOR MEMORY DEVICE

TECHNICAL FIELD

The present invention relates to a semiconductor memory device and, more particularly relates to a semiconductor memory device capable of realizing high-speed sensing operations.

BACKGROUND OF THE INVENTION

A semiconductor memory device such as a DRAM (Dynamic Random Access Memory) includes a sense amplifier per paired bit lines so as to amplify a weak signal read from each memory cell. The sense amplifier needs to raise a potential of one of the paired bit lines to a higher write potential and to reduce that of the other bit line to a lower write potential. Due to this, the sense amplifier is structured so that the higher write potential and the lower write potential are supplied to the sense amplifier when the sense amplifier is activated.

A sensing operation is performed by simultaneously activating a plurality of sense amplifiers. For this reason, relatively high current is applied to a higher-potential drive wiring for supplying the higher write potential and to a lower-potential drive wiring for supplying the lower write potential. As a result, power supply lines that supply the potentials to the higher-potential drive wiring and the lower-potential drive wiring have potential changes, respectively. Such potential changes disadvantageously not only become a noise generation source but also cause a delay in the sensing operation. It is, therefore, desired to suppress the potential changes as much as possible.

The potential change (fluctuation) in the power supply line that supplies the lower potential to the lower-potential drive wiring particularly causes a great delay in the sensing operation. That is, more sense amplifiers available in recent years are configured to not simultaneously supply the higher write potential and the lower write potential but supply the lower write potential in advance to stabilize the sensing operation. Therefore, if the lower write potential is unstable, timing of supplying the higher write potential has to be delayed.

Moreover, some sense amplifiers have been recently configured as overdriven sense amplifiers each of which supplies an overdrive potential higher than the higher write potential to the higher-potential drive wiring in an initial period of the sensing operation. In this case, the lower write potential is normally ground potential, so that the lower-potential drive wiring is not overdriven differently from the higher-potential drive wiring. In this respect, the fluctuation in the lower write potential disadvantageously has great influence on sensing speed.

As described above, the fluctuation in the lower write potential disadvantageously adversely influences the initial period of the sensing operation performed by the sense amplifiers and causes a delay in the sensing operation.

SUMMARY OF THE INVENTION

The present invention has been achieved to solve the conventional problems, and it is an object of the present invention to provide a semiconductor memory device capable of realizing sensing operations at high speed by suppressing a fluctuation in a lower write potential in an initial period of the sensing operation.

According to the present invention, there is provided a semiconductor memory device comprising: a plurality of memory cells arranged in a memory cell area; a plurality of sense amplifiers arranged in a sense amplifier area and each supplying a higher write potential and a lower write potential to each of the memory cells; a first driver circuit supplying the higher write potential to each of the sense amplifiers; a second driver circuit supplying the lower write potential to each of the sense amplifiers; and an auxiliary driver circuit supplying one of the lower write potential and an auxiliary potential lower than the lower write potential to each of the sense amplifiers.

According to the present invention, the semiconductor memory device includes the auxiliary driver circuit supplying the lower write potential or the auxiliary potential lower than the lower write potential to each sense amplifier. It is, therefore, possible to suppress the fluctuation in the lower write potential at start of the sensing operation. The sensing operation can be thereby accelerated as compared with that according to conventional techniques.

According to the present invention, it is preferable that at least the second driver circuit is arranged inside of the sense amplifier area and the auxiliary driver circuit is arranged outside of the sense amplifier area. As mentioned above, more sense amplifiers available in recent years are configured to supply the lower write potential in advance to stabilize the sensing operation. Due to this, it is inappropriate to arrange the second driver circuit supplying the lower write potential outside of the sense amplifier area. However, if the auxiliary driver circuit is also arranged inside of the sense amplifier area, a sufficiently large size of each of transistors constituting the second driver circuit cannot be possibly secured. Considering these respects, the second driver circuit is arranged inside of the sense amplifier area and the auxiliary driver circuit is arranged outside of the sense amplifier area. It is thereby possible to realize the high-speed sensing operation while securing the sufficiently large transistor size of each driver circuit.

It is also preferable that the first driver circuit is arranged outside of the sense amplifier area. By doing so, the transistor size of the second driver circuit arranged inside of the sense amplifier area can be enlarged. It is, therefore, possible to realize a higher-speed sensing operation.

Furthermore, it is preferable that lower write potential supplied by the second driver circuit and the auxiliary potential supplied by the auxiliary driver circuit are supplied via different external terminals. The potentials supplied via the external terminals are smaller than potentials generated inside in potential change due to an increase of load. Therefore, if both the lower write potential and the auxiliary potential are used as the potentials supplied via the external terminals, it is possible to suppress the fluctuation in the lower write potential quite effectively at the start of the sensing operation.

Moreover, it is preferable that the lower-potential drive wiring connecting each of the sense amplifiers to the auxiliary driver circuit is constituted by a plurality of conductor patterns connected in parallel. It the auxiliary driver circuit is arranged outside of the sense amplifier area, a wiring length of the lower-potential drive wiring naturally becomes long. However, if the lower-potential drive wiring is constituted by a plurality of conductor patterns connected in parallel, an increase in wiring resistance can be suppressed.

In this case, the plurality of conductor patterns are preferably formed on different wiring layers. By doing so, it is possible to secure a sufficiently wide wiring pitch and a sufficiently large wiring width. The wiring resistance can be, therefore, effectively reduced. In this case, the plurality of conductor patterns are preferably shorted to one another in a plurality of portions by through hole electrodes formed among the different wiring layers. By performing such so-called wiring backup, it is possible to reduce the wiring resistance more effectively.

According to the present invention, the semiconductor memory device includes the auxiliary driver circuit supplying the lower write potential or the auxiliary potential lower than the lower write potential to each of the sense amplifiers. It is, therefore, possible to suppress the fluctuation in the lower write potential at the start of the sensing operation. The sensing operation can be thereby accelerated as compared with that according to conventional techniques.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
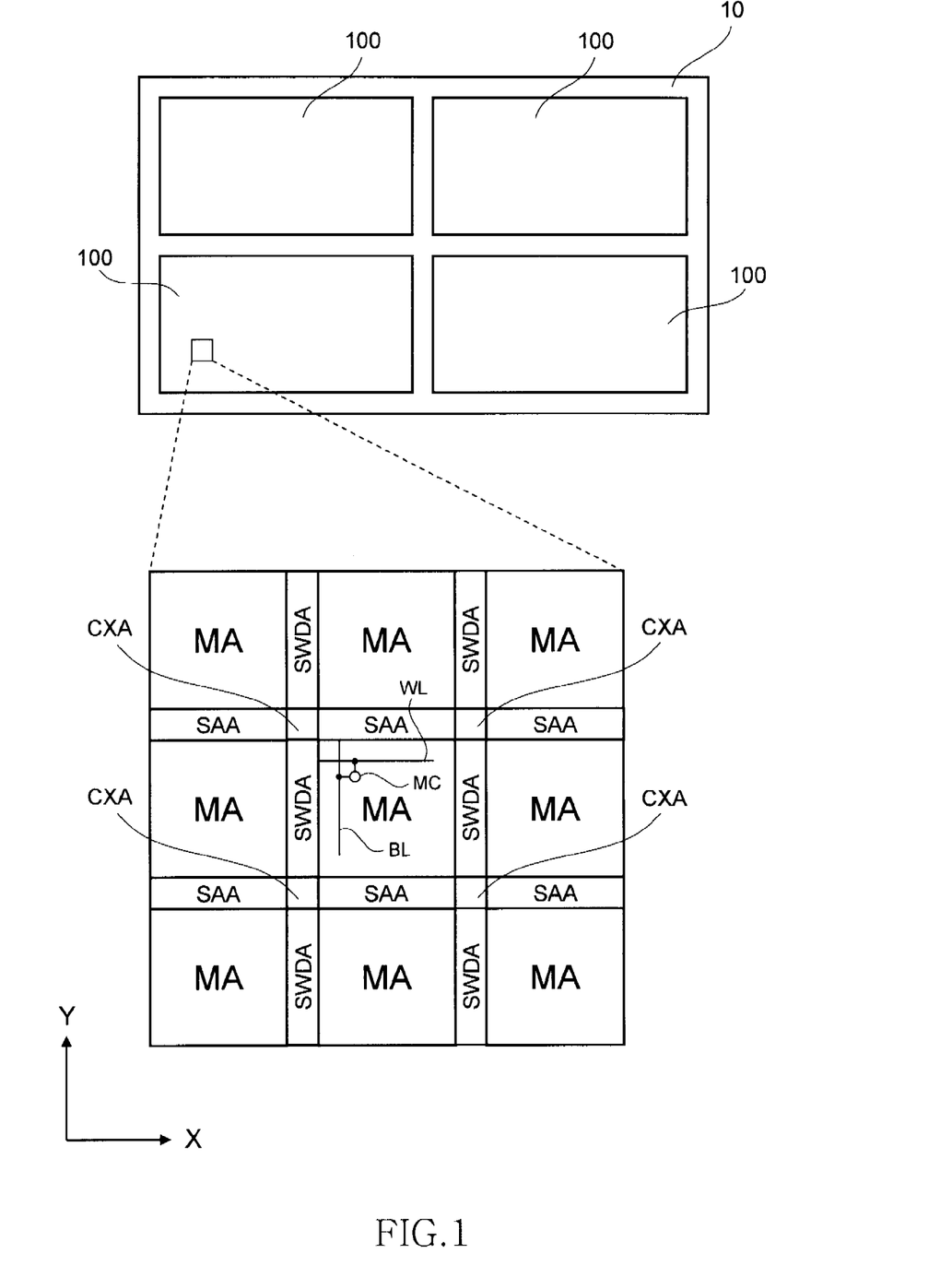
FIG. 1 is a pattern diagram showing an overall structure of a semiconductor memory device and showing an enlarged view of a part of its structure according to a preferred embodiment of the present invention.

FIG. 1 is a pattern diagram showing an overall structure of a semiconductor memory device 10 and showing an enlarged view of a part of its structure according to a preferred embodiment of the present invention.

As shown in the overall diagram of FIG. 1, the semiconductor memory device 10 according to the present embodiment includes a plurality of (four in the embodiment) memory mats 100. Although external terminals such as an address terminal and a power supply terminal and various peripheral circuits such as an address decoder, a timing controller, and an input/output circuit are arranged outside of the memory mats 100, they are not shown in FIG. 1.

As shown in the enlarged view of FIG. 1, each memory mat 100 includes a plurality of memory cell areas MAs arranged in a matrix. Regions between the memory cell areas MAs adjacent in an X direction are used as sub-word areas SWDAs, and those between the memory cell areas MAs adjacent in a Y direction are used as sense amplifier areas SAAs. In the present embodiment, the X direction is an extension direction of word lines WLs and the Y direction is an extension direction of bit lines BLs.

Figure 2:
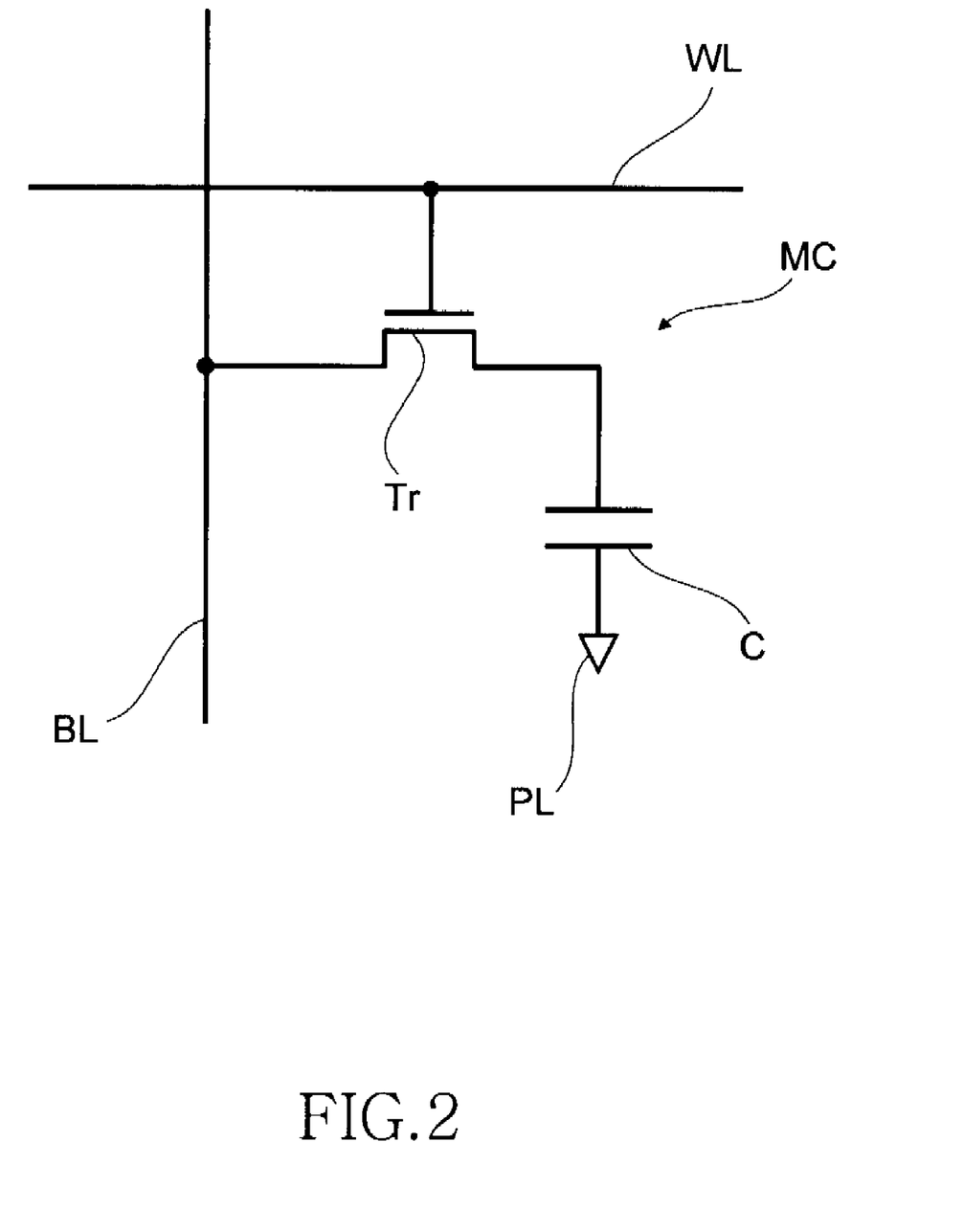
FIG. 2 is a circuit diagram of a memory cell.

Many (e.g., 256K) memory cells MCs are arranged in each memory cell area MA. As shown in FIG. 2, each of the memory cells MCs is configured to include a cell transistor Tr and a cell capacitor C connected in series between each bit line BL and a plate line PL. A gate electrode of the cell transistor Tr is connected to each word line WL. By so configuring, when a word line WL becomes high level, the cell transistor Tr of the memory cell MC is turned on and the cell capacitor C thereof is connected to a corresponding bit line BL.

Meanwhile, when data is written to the memory cell MC, a higher write potential or a lower write potential is supplied to the cell capacitor C of the memory cell MC according to the data to be stored. As described later, the higher write potential is represented by VARY, which is set to, for example, 1.4 V and the lower write potential is represented by VSSA, which is set to, for example, 0 V (ground potential) in the present embodiment.

When data is read from a memory cell MC, the corresponding bit line BL is precharged with an intermediate potential, i.e., (VARY-VSSA)/2 (e.g., 0.7 V, hereinafter, simply "VARY/2") and the cell transistor Tr thereof is then turned on. By doing so, if the higher write potential is written to the cell capacitor C, a potential of the bit line BL rises slightly from the intermediate potential. If the lower write potential is written to the cell capacitor C, the potential of the bit line BL falls slightly from the intermediate potential.

It is a corresponding sense amplifier SA arranged in one of the sense amplifier areas SAAs that drives the bit line BL to follow writing or reading of the data.

Figure 3:
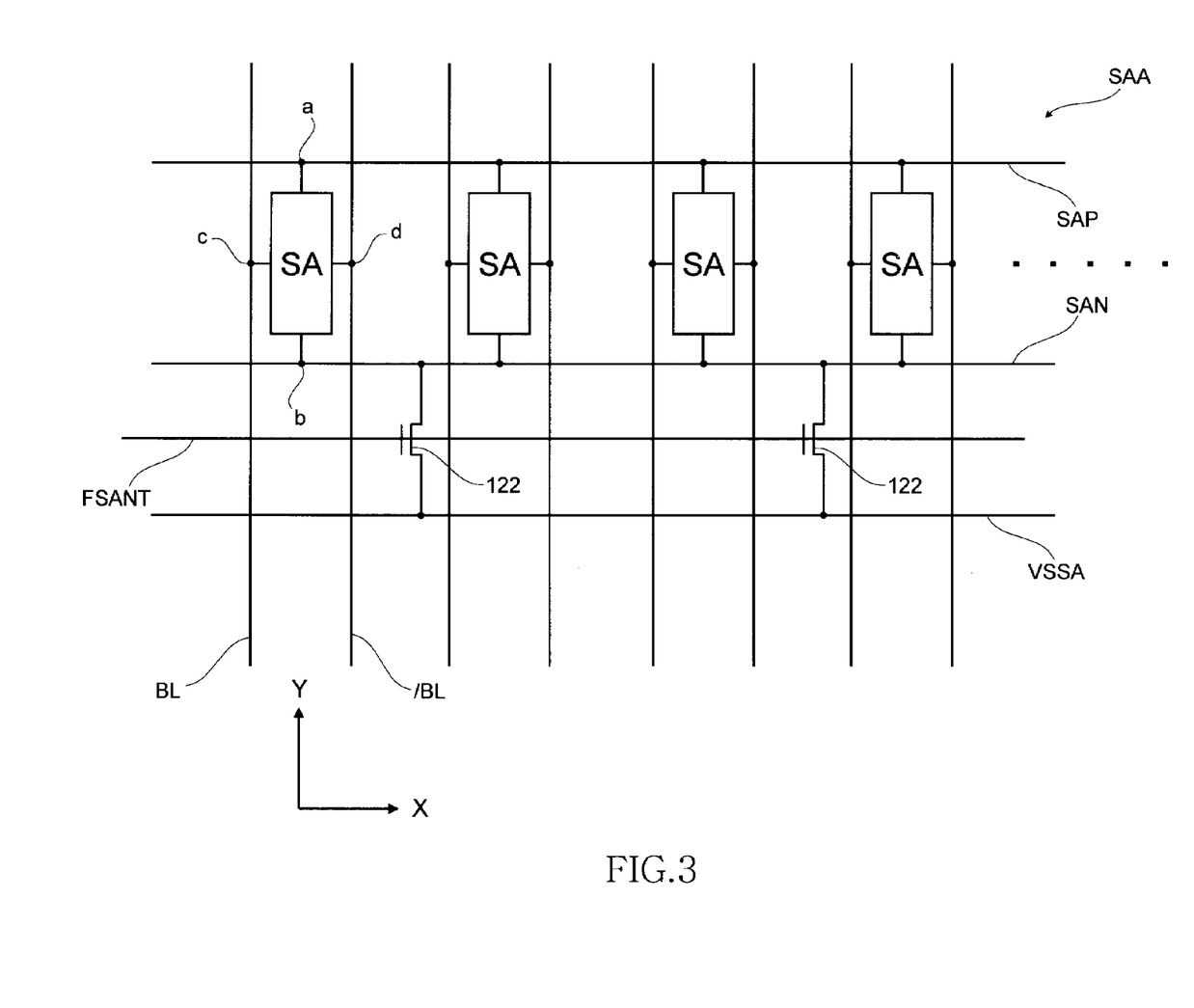
FIG. 3 is a circuit diagram showing circuits formed in each sense amplifier area.

FIG. 3 is a circuit diagram showing circuits formed in each sense amplifier area SAA.

As shown in FIG. 3, each sense amplifier area SAA includes a plurality of sense amplifiers SAs arranged in the X direction. Each of the sense amplifiers SAs includes four nodes, i.e., a pair of power supply nodes a and b and a pair of signal nodes c and d. The power supply node a is connected to a higher-potential drive wiring SAP and the power supply node b is connected to a lower-potential drive wiring SAN. Further, the signal nodes c and d are connected to corresponding paired bits BL and /BL, respectively.

Figure 4:
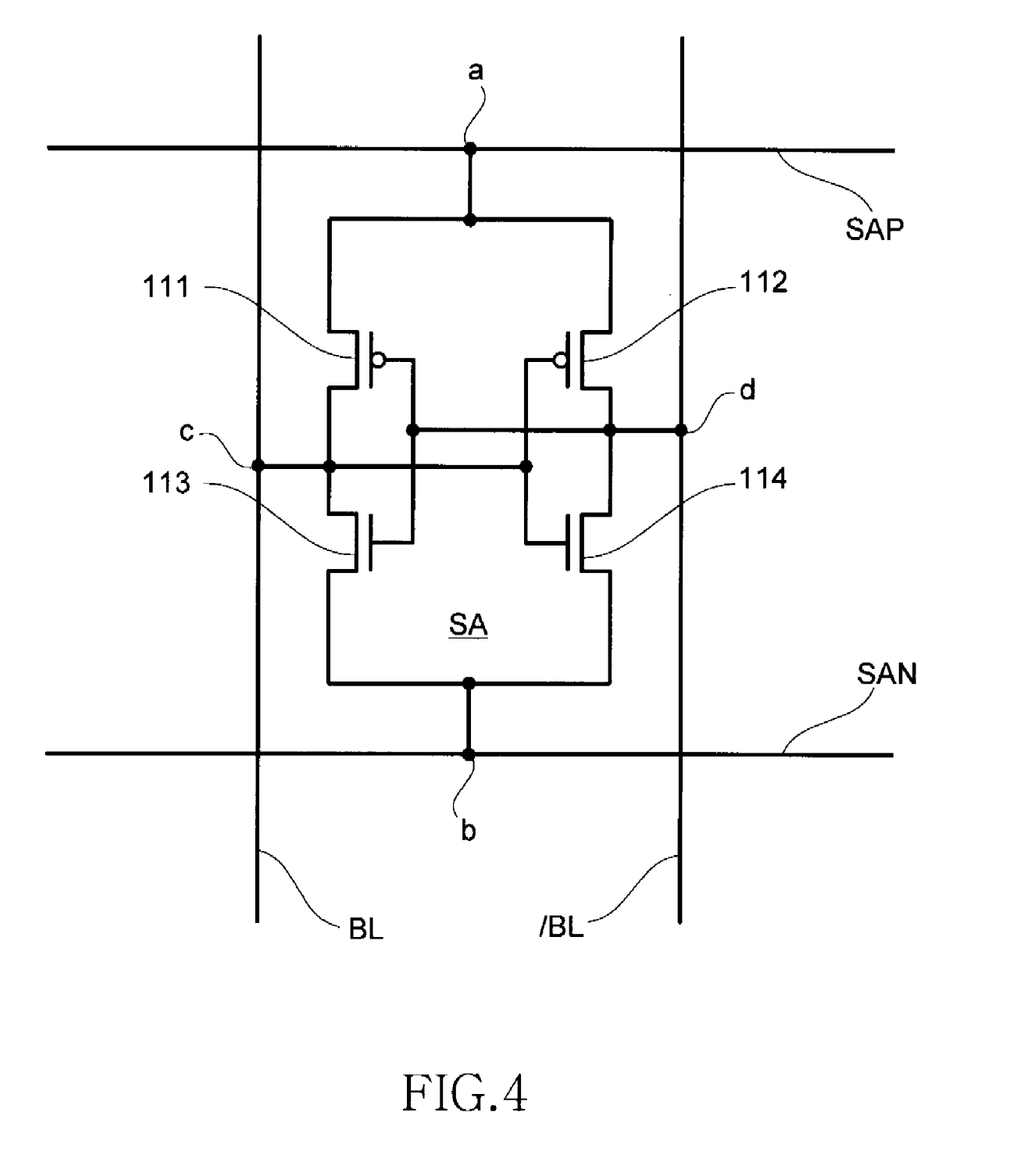
FIG. 4 is a circuit diagram showing a configuration of each sense amplifier.

FIG. 4 is a circuit diagram showing a configuration of each sense amplifier SA.

As shown in FIG. 4, the sense amplifier SA includes P-channel MOS transistors 111 and 112 and N-channel MOS transistors 113 and 114. The P-channel MOS transistor 111 and the N-channel MOS transistor 113 are connected in series between the power supply nodes a and b. A contact between the P-channel MOS transistor 111 and the N-channel MOS transistor 113 is connected to the signal node c, and gate electrodes of the P-channel MOS transistor 111 and the N-channel MOS transistor 113 are connected to the other signal node d. Likewise, the P-channel MOS transistor 112 and the N-channel MOS transistor 114 are connected in series between the power supply nodes a and b. A contact between the P-channel MOS transistor 112 and the N-channel MOS transistor 114 is connected to the signal node d, and gate electrodes of the P-channel MOS transistor 112 and the N-channel MOS transistor 114 are connected to the other signal node c.

The sense amplifier SA has such a flip-flop structure. Due to this, if a potential difference is generated between the paired bit lines BL and /BL while predetermined potentials are supplied to the higher-potential drive wiring SAP and the lower-potential drive wiring SAN, respectively, then the potential of the higher-potential drive wiring SAP is supplied to one of the paired bit lines BL and /BL, and that of the lower-potential drive wiring SAN is supplied to the other bit line. In the present embodiment, the higher write potential VARY is supplied to the higher-potential drive wiring SAP and the lower write potential VSSA is supplied to the lower-potential drive wiring SAN as described later. Moreover, in an initial period of a sensing operation, the ground potential VSS is temporarily supplied to the lower-potential drive wiring SAN whereas an overdrive potential VOD higher than the higher write potential VARY is temporarily supplied to the higher-potential drive wiring SAP.

Referring back to FIG. 3, driver circuits 122 each supplying the lower write potential VSSA to the lower-potential drive wiring SAN are arranged in each sense amplifier area SAA. In the present embodiment, one driver circuit 122 is allocated to a plurality of sense amplifiers SAs. However, the number of driver circuits 122 arranged in one sense amplifier area SAA is not limited to a specific number. For example, one driver circuit 122 can be allocated per sense amplifier SA.

Figure 5:
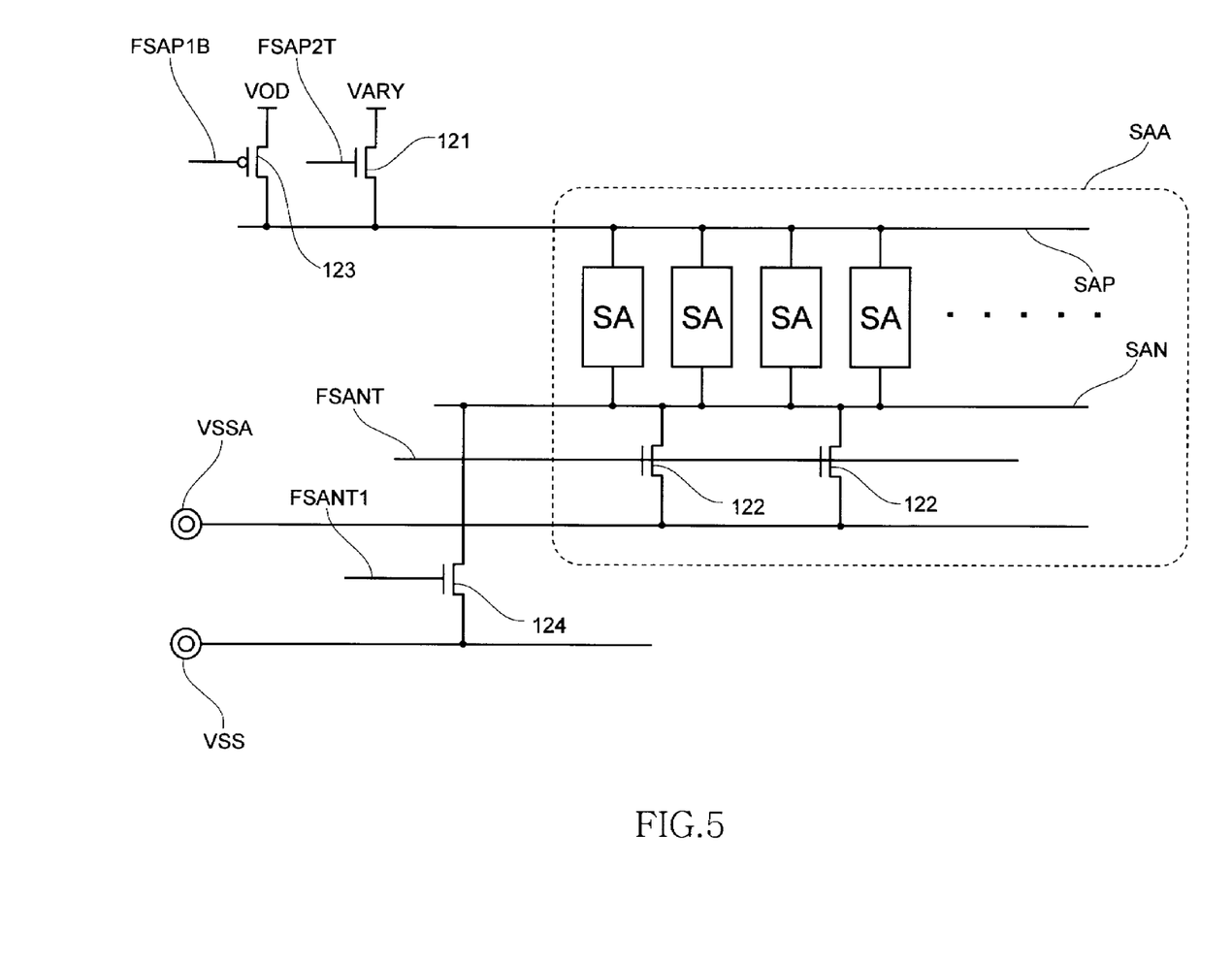
FIG. 5 shows a positional relationship between driver circuits and the sense amplifier area.

It is to be noted that because of a limited area of each sense amplifier area SAA, a current driving capability of each driver circuit 122 is limited accordingly. In the present embodiment, however, driver circuits 121 and 123 for driving the higher-potential drive wiring SAP are not arranged inside of each sense amplifier area SAA but arranged outside thereof as shown in FIG. 5. Due to this, it is possible to set a size of each driver circuit 122 sufficiently large. In other words, it is possible to ensure a sufficiently high current driving capability of each driver circuit 122 even if the driver circuit 122 is arranged inside of the sense amplifier area SAA.

Furthermore, in the present embodiment, each sense amplifier SA is configured to not simultaneously drive the higher-potential drive wiring SAP and the lower-potential drive wiring SAN but drive the lower-potential drive wiring in advance, as described later. Therefore, by arranging the driver circuits 122 supplying the lower write potential VSA inside of each sense amplifier area SAA, it is possible to ensure acceleration of the sensing operation.

Moreover, in the present embodiment, as shown in FIG. 5, an auxiliary driver circuit 124 is arranged outside of the sense amplifier area SAA. The auxiliary driver circuit 124 is a driver circuit for temporarily supplying the ground potential VSS to the lower-potential drive wiring SAN in the initial period of the sensing operation. The auxiliary driver circuit 124 is constituted by an N-channel MOS transistor having a source connected to the ground potential VSS and having a drain connected to the lower-potential drive wiring SAN.

The ground potential VSS is a potential supplied via a different external terminal from that for supplying the lower write potential VSSA. The ground potential VSS is widely used as source potentials of various N-channel MOS transistors that constitute the peripherals. Although the ground potential VSS is actually equal to the lower write potential VSSA (both are ground potential), the ground potential VSS and the lower write potential VSSA are supplied via the different external terminals so as to avoid mutual interference of power supply noise between each sense amplifier SA and each of the peripherals. The potentials supplied via the external terminals are smaller than potentials generated inside in potential change due to an increase of load. Therefore, if the potentials supplied via the external terminals are used, it is possible to effectively suppress a fluctuation in the lower write potential VSSA at the start of the sensing operation.

As shown in FIG. 5, the auxiliary driver circuit 124 is arranged outside of each sense amplifier area SAA. It is not always essential to arrange the auxiliary driver circuit 124 outside of the sense amplifier area SAA. However, if the auxiliary driver circuit 124 is arranged inside of each sense amplifier area SAA, then a transistor size of each driver circuit 122 is made smaller and the significance of assistance of the auxiliary driver circuit 124 in the driver circuits 122 is reduced. Considering this respect, the auxiliary driver circuit 124 is preferably arranged outside of each sense amplifier area SAA as described in the present embodiment.

In the present embodiment, by auxiliarily using the ground potential VSS, the fluctuation in the lower write potential VSSA in the initial period of the sensing operation can be suppressed.

Similarly to the auxiliary driver circuit 124, the driver circuits 121 and 123 for driving the higher-potential drive wiring SAP are not arranged inside of each sense amplifier area SAA but arranged outside thereof as shown in FIG. 5.

As shown in FIG. 5, the driver circuits driving the higher-potential drive wiring SAP are a driver circuit 121 that supplies the higher write potential VARY and an overdrive circuit 123 that supplies the overdrive potential VOD. As already mentioned, the overdrive potential VOD is higher than the higher write potential VARY and temporarily supplied to the higher-potential drive wiring SAP during the initial period of the sensing operation.

In the present embodiment, the overdrive circuit 123 supplying the overdrive potential VOD is constituted by a P-channel MOS transistor whereas the driver circuit 121 supplying the higher write potential VARY is constituted by an N-channel MOS transistor.

By arranging the driver circuit 121, the overdrive circuit 123, and the auxiliary driver circuit 124 outside of each sense amplifier area SAA, only the driver circuits 122 supplying the lower write potential VSSA are arranged inside of each sense amplifier area SAA. It is, therefore, possible to realize the sensing operation at high speed while ensuring that each driver circuit 122 has sufficiently large transistor size.

A region for arranging the driver circuit 121, the overdrive circuit 123, and the auxiliary driver circuit 124 is not limited to a specific one as long as the region is located outside of each sense amplifier area SAA. For example, the driver circuit 121, the overdrive circuit 123, and the auxiliary driver circuit 124 can be arranged in a crossing area CXA as shown in FIG. 1 or outside of each memory mat 100.

In this way, according to the present embodiment, the driver circuits (the driver circuit 121 and the overdrive circuit 123) driving the higher-potential drive wiring SAP are both arranged outside of each sense amplifier area SAA. Naturally, therefore, the higher-potential drive wiring SAP connecting these driver circuits 121 and 123 to the sense amplifiers SAs becomes long. Likewise, because of arrangement of the auxiliary driver circuit 124 outside of the sense amplifier area SAA, a distance between the auxiliary driver circuit 124 and each of the sense amplifiers SAs becomes long. As a result, voltage drop occurs. To suppress the voltage drop, it is necessary to reduce resistances of the higher-potential drive wiring SAP and the lower-potential drive wiring SAN as much as possible. From these viewpoints, the higher-potential drive wiring SAP and the lower-potential drive wiring SAN according to the present embodiment are configured to have multi-layer structures. Namely, by employing a plurality of conductor patterns in parallel for each of the higher-potential drive wiring SAP and the lower-potential drive wiring SAN, their resistances are reduced.

Figure 6:
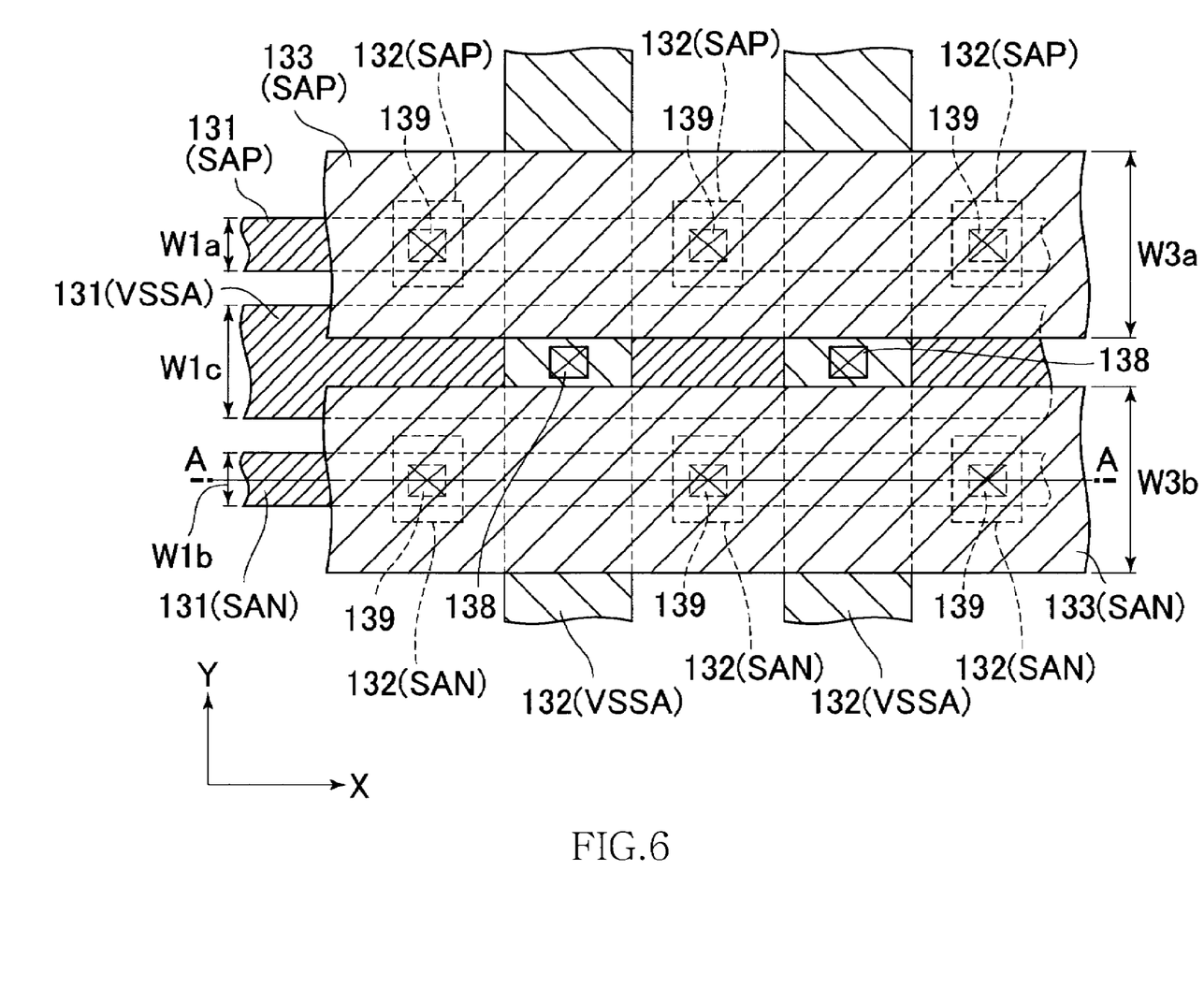
FIG. 6 is a schematic plan view showing a configuration of the conductor patterns constituting the higher-potential drive wiring SAP and the lower-potential drive wiring SAN.
Figure 7:
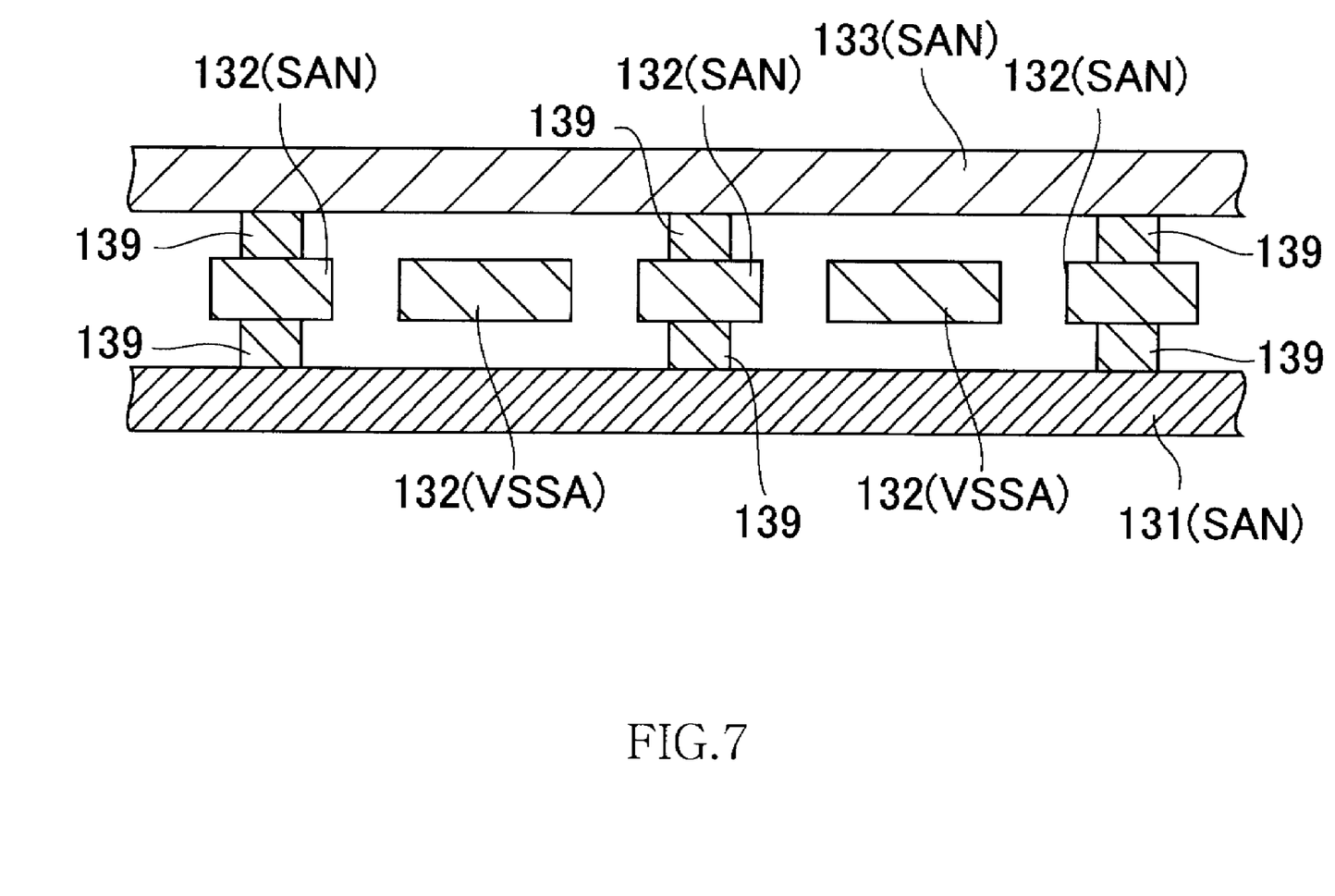
FIG. 7 is a schematic cross-sectional view taken along a line A-A of FIG. 6.

FIG. 6 is a schematic plan view showing a configuration of the conductor patterns constituting the higher-potential drive wiring SAP and the lower-potential drive wiring SAN. FIG. 7 is a schematic cross-sectional view taken along a line A-A of FIG. 6.

As shown in FIGS. 6 and 7, the higher-potential drive wiring SAP is constituted by a conductor pattern 131 (SAP) formed on a first wiring layer and a conductor pattern 133 (SAP) formed on a third wiring layer. The conductor patterns 131 (SAP) and 133 (SAP) are shorted to each other in a plurality of portions by through hole electrodes 139 formed between the conductor patterns 131 (SAP) and 133 (SAP) in the respective portions. Likewise, the lower-potential drive wiring SAN is constituted by a conductor pattern 131 (SAN) formed on the first wiring layer and a conductor pattern 133 (SAN) formed on the third wiring layer. The conductor patterns 131 (SAN) and 133 (SAN) are shorted to each other in a plurality of portions by through hole electrodes 139 formed between the conductor patterns 131 (SAN) and 133 (SAN) in the respective portions. Conductor patterns 132 (VSSA) formed on a second wiring layer are present between the first wiring layer and the third wiring layer. Each of the conductor patterns 131 to 133 is preferably, but not limited to, an aluminum (Al) wiring.

As shown in FIG. 6, the conductor patterns mainly extending in the X direction that is a longitudinal direction of the sense amplifier areas SAAs are formed on the first and third wiring layers, and the conductor patterns mainly extending in the Y direction are formed on the second layer. Because of formation of the conductor patterns extending in the X direction on the first and third wiring layers, the conductor patterns are suited to form the higher-potential drive wiring SAP or the lower-potential drive wiring SAN.

Moreover, many conductor patterns such as a conductor pattern 131 (VSSA) to which the lower write potential VSSA is supplied other than the conductor pattern 131 (SAP) constituting the higher-potential drive wiring SAP and the conductor pattern 131 (SAN) constituting the lower-potential drive wiring SAN are formed on the first wiring layer. Due to this, it is difficult to secure sufficiently large wiring widths of the conductor patterns 131 (SAP) and 131 (SAN). Nevertheless, according to the present embodiment, the conductor patterns 133 (SAP) and 133 (SAN) formed on the third wiring layer back up the conductor patterns 131 (SAP) and 131 (SAN), respectively. This makes it possible to sufficiently reduce the resistances of the higher-potential drive wiring SAP and the lower-potential drive wiring SAN.

Furthermore, the conductor patterns 132 (VSSA) formed on the second wiring layer are those to which the lower write potential VSSA is supplied, and shorted to the conductor pattern 131 (VSSA) formed on the first wiring layer in a plurality of portions via through hole electrodes 138 formed in the respective portions. As described above, the lower write potential VSSA is not an internal potential generated in a semiconductor memory device but a potential supplied via the external terminal. Due to this, conductor patterns orthogonal to each other can be employed without the need to use a plurality of conductor patterns extending in the same direction (X direction) such as those constituting the higher-potential drive wiring SAP or the lower-potential drive wiring SAN. In this way, according to the present embodiment, the conductor patterns 132 (VSSA) formed on the second wiring layer back up the conductor pattern 131 (VSSA) formed on the first wiring layer. It is, therefore, possible to sufficiently reduce resistances of the conductor patterns to which the lower write potential VSSA is supplied.

To further reduce the resistances of the higher-potential drive wiring SAP and the lower-potential drive wiring SAN, wiring widths W3a and W3b of the conductor patterns 133 (SAP) and 133 (SAN) are preferably set larger than wiring widths W1a and W1b of the conductor patterns 131 (SAP) and 131 (SAN), respectively as shown in FIG. 6. In other words, by causing the conductor patterns 133 (SAP) and 133 (SAN) to back up the conductor patterns 131 (SAP) and 131 (SAN) respectively, the wiring widths W1a and W1b of the conductor patterns 131 (SAP) and 131 (SAN) can be set small to some extent. Wiring widths of the other conductor patterns formed on the first wiring layer such as the conductor pattern 131 (VSSA) to which the lower write potential VSSA is supplied can be set large, accordingly. FIG. 6 shows a case where a wiring width W1c of the conductor pattern 131 (VSSA) is set larger than the wiring widths W1a and W1b of the respective conductor patterns 131 (SAP) and 131 (SAN).

Configurations of principal parts of the semiconductor memory device 10 according to the present embodiment have been described so far. Operations performed by the semiconductor memory device 10 according to the embodiment will be described next while paying attention to the sensing operation performed by the sense amplifiers SA.

Figure 8:
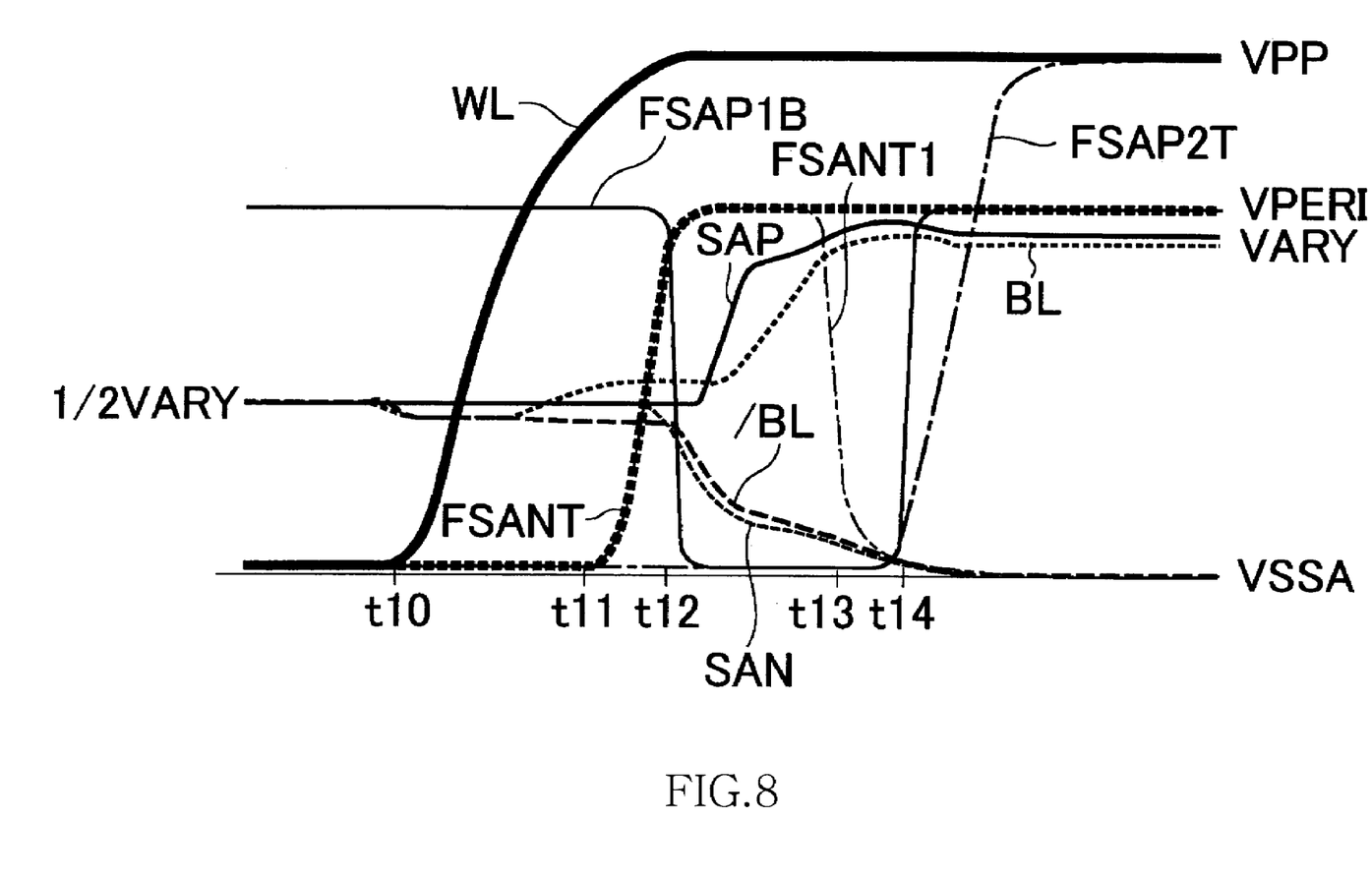
FIG. 8 is an operational waveform view for explaining an operation performed by the sense amplifiers.

FIG. 8 is an operational waveform view for explaining an operation performed by the sense amplifiers SA.

First, before time t10, the paired bit lines BL and /BL are precharged with VARY/2. At the time t10, a level of the word line WL is raised. By doing so, the cell transistor Tr included in each of the memory cells MCs connected to the word line WL is turned on. As a result, the cell capacitor C included in each of the memory cells MCs connected to the word line WL is shorted to the corresponding bit line BL (or /BL), thus changing the potential of the bit line BL (or /BL).

At time t11, a control signal FSANT for controlling the driver circuits 122 is activated to high level, and a control signal FSANT1 for controlling the auxiliary driver 124 is activated to high level. By doing so, the lower-potential drive wiring SAN is connected to both the lower write potential VSSA and the ground potential VSS, and the sense amplifiers SA start the sensing operation. At this moment, the higher-potential drive wiring SAP is not driven yet. Due to this, each sense amplifier SA can lower a level of only one of the paired bit lines BL and /BL and cannot lower a level of the other bit line. The reason for driving the lower-potential drive wiring SAN in advance is as follows. P-channel MOS transistors are generally larger in characteristic irregularities than N-channel MOS transistors. Therefore, if the four transistors constituting each of the sense amplifiers SAs are actuated simultaneously, the sensing operation performed by the sense amplifiers SAs can possibly become unstable.

Moreover, a current flowing out from the sense amplifiers SAs via the lower-potential drive wiring SAN is distributed into the lower write potential VSSA and the ground potential VSS. Due to this, the voltage drop in the lower write potential VSSA is smaller than that if the auxiliary driver circuit 124 is not employed. Namely, the fluctuation in the lower write potential VSSA in the initial period of the sensing operation becomes small. As a result, the potential of the lower-potential drive wiring SAN becomes higher than the original lower write potential, i.e., the ground potential VSSA.

After the driving of the lower-potential drive wiring SAN proceeds to some extent, a control signal FSAP1B for controlling the overdrive circuit 123 is activated to low level at time t12. By doing so, the higher-potential drive wiring SAP is driven to the overdrive potential VOD to allow the sensing operation to further proceed. In other words, each sense amplifier SA lowers the level of one of the paired bit lines BL and /BL and raises the level of the other bit line.

After the sensing operation proceeds to some extent, the control signal FSANT1 for controlling the auxiliary driver circuit 124 is activated to low level at time t13. The auxiliary driver circuit 124 thereby finishes assisting in the driver circuits 122. Moreover, at time t14, the control signal FSAP1B for controlling the overdrive circuit 123 is deactivated to high level, and a control signal FSAP2T for controlling the driver circuit 121 is activated to high level. By doing so, the sense amplifiers SAs finish an overdrive operation and the higher-potential drive wiring SAP is driven to the higher write potential VARY.

Through these operations, the sense amplifiers SA eventually lower the potential of one of the paired bit lines BL and /BL to the lower write potential VSSA and raises that of the other bit line to the higher write potential VARY. Accordingly, the data destroyed after being read from each memory cell MC is restored.

As explained above, the semiconductor memory device 10 according to the present embodiment includes the auxiliary driver circuit 124 for connecting the lower-potential drive wiring SAN to the ground potential VSS in the initial period of the sensing operation. It is, therefore, possible to realize the sensing operation at high speed. Besides, the ground potential VSS is supplied via the external terminal different from that used to supply the lower write potential VSSA. It is, therefore, possible to offer greater assistance to the driver circuits.

Furthermore, the semiconductor memory device 10 includes four types of driver circuits for supplying operating voltages to the sense amplifiers SA. Among these, the driver circuits 122 supplying the lower write potential VSSA are arranged inside of each sense amplifier area SAA. On the other hand, other driver circuits, i.e., the driver circuit 121 supplying the higher write potential VARY, the overdrive circuit 123 supplying the overdrive potential VOD, and the auxiliary driver circuit 124 supplying the ground potential VSS are arranged outside of each sense amplifier area SAA. By so arranging, it is possible to realize the high-speed sensing operation while securing sufficiently large transistor sizes of the respective driver circuits.

Moreover, according to the present embodiment, the higher-potential driver wiring SAP and the lower-potential driver wiring SAN are not constituted only by the conductor patterns 131 (SAP) and 131 (SAN) formed on the first wiring layer, respectively but the conductor patterns 133 (SAP) and 133 (SAN) formed on the third wiring layer back up the conductor patterns 131 (SAP) and 131 (SAN), respectively. The resistances of the higher-potential drive wiring SAP and the lower-potential drive wiring SAN can be, therefore, effectively reduced.

In the present embodiment, the ground potential VSS equal to the lower write potential VSSA is used as an auxiliary potential for a source of the auxiliary driver circuit 124. Alternatively, a potential lower than the lower write potential VSSA can be used as the auxiliary potential.

Figure 9:
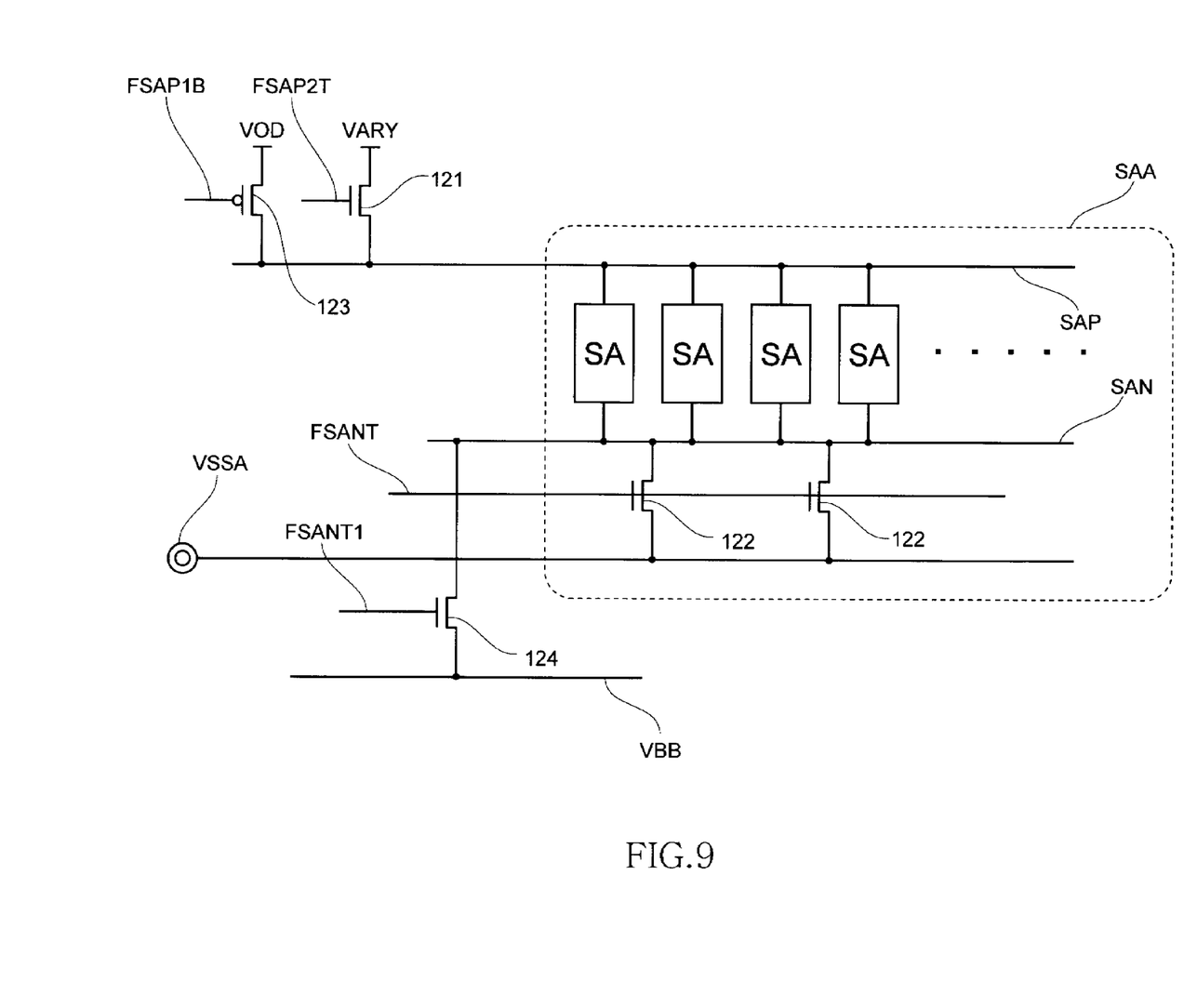
FIG. 9 is a modified example of the preferred embodiment of the present invention.

In another embodiment shown in FIG. 9, the auxiliary driver circuit 124 is connected between the lower-potential drive wiring SAN and a wiring supplying a substrate potential VBB. The substrate potential VBB is a negative potential generated inside differently from the ground potential VSS. If such a substrate potential VBB is used as the auxiliary potential, the potential of the lower-potential drive wiring SAN is possibly lowered to the negative potential in the initial period of the sensing operation depending on driving capability of each of the driver circuits. However, as shown in FIG. 8, the auxiliary driver circuit 124 is turned on only during a period from the time t11 to the time t13. Due to this, the final potential of the lower-potential drive wiring SAN always becomes equal to the lower write potential VSSA.

Alternatively, one of or both of a timing of activating the control signal FSANT1 to high level and a timing of deactivating the control signal FSANT1 to low level can be controlled based on the potential of the lower-potential drive wiring SAN.

Figure 10:
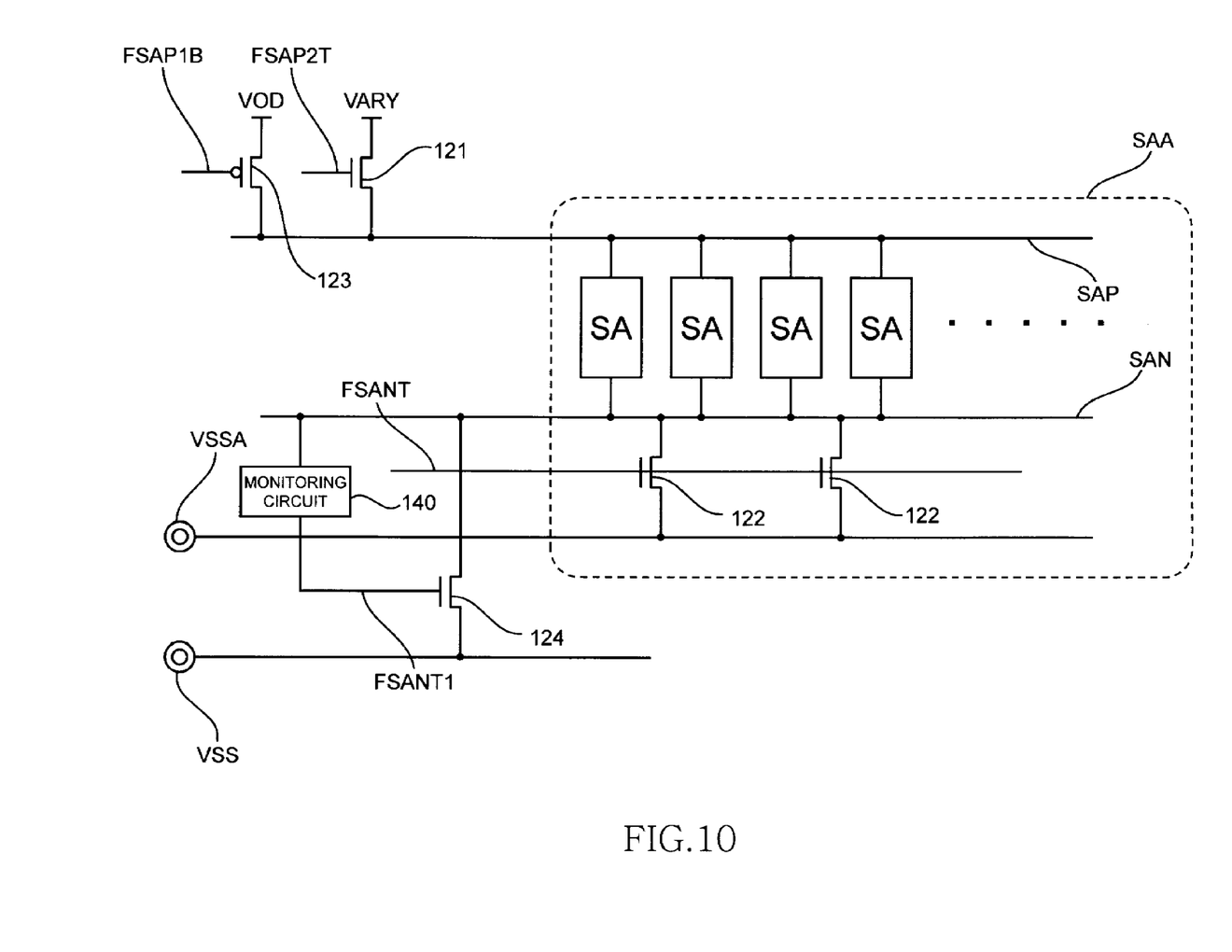
FIG. 10 is another modified example of the preferred embodiment of the present invention.

Namely, as shown in FIG. 10, a monitoring circuit 140 monitoring the potential of the lower-potential drive wiring SAN is provided. Using the monitoring circuit 140, after the control signal FSANT is activated to high level, the control signal FSANT1 can be set to high level if the potential of the lower-potential drive wiring SAN is equal to or higher than a predetermined value and set to low level if the potential thereof is lower than the predetermined value, for example. Accordingly, the auxiliary driver circuit 124 is turned on only during a period in which the lower write potential VSSA fluctuates. It is, therefore, possible to further ensure reducing the fluctuation in the lower write potential VSSA.

The present invention is in no way limited to the aforementioned embodiments, but rather various modifications are possible within the scope of the invention as recited in the claims, and naturally these modifications are included within the scope of the invention.

For example, the embodiments have been described while referring to the case where the present invention is applied to the DRAM by way of example. However, the application target of the present invention is not limited to the DRAM. As long as scenes amplifiers are provided, the present invention is also applicable to other types of semiconductor devices.

What is claimed is:

1. A semiconductor memory device comprising:
    a plurality of memory cells arranged in a memory cell area;
    a plurality of sense amplifiers arranged in a sense amplifier area and each supplying a higher write potential and a lower write potential to each of the memory cells;
    a first driver circuit supplying the higher write potential to each of the sense amplifiers;
    a second driver circuit supplying the lower write potential to each of the sense amplifiers; and
    an auxiliary driver circuit supplying one of the lower write potential and an auxiliary potential lower than the lower write potential to each of the sense amplifiers;
    wherein at least the second driver circuit is arranged inside of the sense amplifier area and the auxiliary driver circuit is arranged outside of the sense amplifier area.

2. The semiconductor memory device as claimed in claim 1, wherein the first driver circuit is arranged outside of the sense amplifier area.

3. The semiconductor memory device as claimed in claim 2, wherein the lower write potential and the auxiliary potential are supplied via different external terminals.

4. The semiconductor memory device as claimed in claim 1, wherein the first driver circuit is arranged outside of the sense amplifier area.

5. The semiconductor memory device as claimed in claim 1, wherein the lower write potential and the auxiliary potential are supplied via different external terminals.

6. The semiconductor memory device as claimed in claim 1, further comprising a lower-potential drive wiring that connects each of the sense amplifiers to the auxiliary driver circuit,
    the lower-potential drive wiring including a plurality of conductor patterns connected in parallel.

7. The semiconductor memory device as claimed in claim 6, wherein the plurality of conductor patterns are formed on different wiring layers.

8. The semiconductor memory device as claimed in claim 7, wherein the plurality of conductor patterns are shorted to one another in a plurality of portions by through hole electrodes formed between the different wiring layers.

9. A semiconductor memory device comprising:

a plurality of memory cells arranged in a memory cell area;

a plurality of sense amplifiers arranged in a sense amplifier area, wherein each of the sense amplifiers is electrically connected to one or more associated memory cells, and each of the sense amplifiers comprises first and second driving voltage receiving nodes;

a first driving voltage supply circuit electrically connected to the first driving voltage receiving node of each of the sense amplifiers;

a second driving voltage supply circuit electrically connected to the second driving voltage receiving node of each of the sense amplifiers;

wherein the first driving voltage supply circuit is disposed in the sense amplifier area and the second driving voltage supply circuit is disposed outside the sense amplifier area, such that there is no driving voltage supply circuit within the sense amplifier area that is connected to the second driving voltage receiving node of each of the sense amplifiers.

10. The semiconductor memory device as claimed in claim 9, further comprising:

a third driving voltage supply circuit, which supplies a driving voltage that is substantially equal to or lower than a driving voltage supplied by the first driving voltage supply circuit, wherein the third driving voltage supply circuit is disposed outside the sense amplifier area, and is electrically connected to the first driving voltage receiving node of each of the sense amplifiers.

11. The semiconductor memory device as claimed in claim 10, wherein the third voltage supply circuit changes from an activated state to a deactivated state earlier that the first driving voltage supply circuit.

12. The semiconductor memory device as claimed in claim 11, wherein each of the first and third driving voltage supply circuits is activated before the second driving voltage supply circuit is activated.

13. The semiconductor memory device as claimed in claim 10, wherein the second driving voltage supply circuit comprises a first driver electrically connected between a first voltage line and the second driving voltage receiving node of each of the sense amplifiers, and a second driver electrically connected between a second voltage line and the second driving voltage receiving node of each of the sense amplifiers; and wherein the first voltage line has a higher voltage than the second voltage line.

14. The semiconductor memory device as claimed in claim 13, wherein each of the first and third driving voltage supply circuits is activated before each of the first and second drivers in the second driving voltage supply circuit.

15. The semiconductor memory device as claimed in claim 9, wherein the second driving voltage supply circuit comprises a first driver electrically connected between a first voltage line and the second driving voltage receiving node of each of the sense amplifiers, and a second driver electrically connected between a second voltage line and the second driving voltage receiving node of each of the sense amplifiers; and wherein the first voltage line has a higher voltage than the second voltage line.

16. The semiconductor memory device as claimed in claim 15, wherein the second driver changes from an activated state to a deactivated state earlier than the first driver.

17. A semiconductor memory device comprising:

a plurality of memory cells arranged in a memory cell area;

a plurality of sense amplifiers arranged in a sense amplifier area and each supplying a higher write potential and a lower write potential to each of the memory cells;

a first driver circuit supplying the higher write potential to each of the sense amplifiers;

a second driver circuit supplying the higher write potential to each of the sense amplifiers; and an auxiliary driver circuit arranged outside of the sense amplifier area and supplying one of the lower write potential and an auxiliary potential lower than the lower write potential to each of the sense amplifiers.

18. The semiconductor memory device as claimed in claim 17, wherein the first driver circuit is arranged outside of the sense amplifier area.

19. The semiconductor memory device as claimed in claim 17, wherein the lower write potential and the auxiliary potential are supplied via different external terminals.

20. The semiconductor memory device as claimed in claim 18, wherein the lower write potential and the auxiliary potential are supplied via different external terminals.

* * * * *